US009679792B2

(12) United States Patent
Atlas

(10) Patent No.: US 9,679,792 B2
(45) Date of Patent: Jun. 13, 2017

(54) TEMPERATURE CONTROL SYSTEM FOR ELECTROSTATIC CHUCKS AND ELECTROSTATIC CHUCK FOR SAME

(71) Applicant: Noah Precision, LLC, Vancouver, WA (US)

(72) Inventor: Boris Atlas, San Jose, CA (US)

(73) Assignee: Noah Precision, LLC, Vancouver, WA (US)

( * ) Notice: Subject to any disclaimer, the term of this patent is extended or adjusted under 35 U.S.C. 154(b) by 671 days.

(21) Appl. No.: 14/063,005

(22) Filed: Oct. 25, 2013

(65) Prior Publication Data

US 2014/0131005 A1    May 15, 2014

Related U.S. Application Data

(60) Provisional application No. 61/718,680, filed on Oct. 25, 2012.

(51) Int. Cl.
| | |
|---|---|
| *H05B 1/02* | (2006.01) |
| *H01L 21/67* | (2006.01) |
| *F25B 21/04* | (2006.01) |
| *H01L 21/683* | (2006.01) |

(52) U.S. Cl.
CPC ........ *H01L 21/67103* (2013.01); *F25B 21/04* (2013.01); *H01L 21/67248* (2013.01); *H01L 21/6831* (2013.01); *F25B 2321/023* (2013.01)

(58) Field of Classification Search
CPC ......... H01L 21/67103; H01L 21/67248; H01L 21/6831; F25B 21/04; F25B 2321/023; H05B 1/02; H05B 1/0233; H05B 3/0047

USPC ............... 219/121.43, 494, 497, 483–486; 392/418; 118/724; 156/345.52, 345.53
See application file for complete search history.

(56) References Cited

U.S. PATENT DOCUMENTS

| | | | | |
|---|---|---|---|---|
| 5,966,940 | A * | 10/1999 | Gower ................... | F25B 21/04 165/61 |
| 5,987,892 | A * | 11/1999 | Watanabe ............ | A47G 29/141 62/259.2 |
| 5,996,353 | A * | 12/1999 | Maxwell .............. | B01D 5/0042 62/259.2 |
| 6,080,969 | A * | 6/2000 | Goto ................. | H01L 21/67103 118/724 |
| 6,822,202 | B2 | 11/2004 | Atlas | |

(Continued)

*Primary Examiner* — Mark Paschall
(74) *Attorney, Agent, or Firm* — Hammer & Associates, P.C.

(57) ABSTRACT

A temperature control system, a wafer chuck, a thermal module for use with the chuck, and an apparatus for use in semiconductor manufacture are disclosed herein. The temperature control system includes: a target having a temperature, a fluid circulation loop coupled to the target for controlling the temperature of the target, a heating heat exchanger coupled to the fluid circulation loop for selectively providing heat to the fluid circulation loop, a cooling heat exchanger coupled to the fluid circulation loop for selectively providing cooling to the fluid circulation loop and a plurality of thermal electric elements carried by the target for selectively providing heating or cooling to the target. The heating heat exchanger and cooling heat exchanger provide gross control of the temperature of the target, and the plurality of thermal electric elements provide fine control of the temperature of the target.

6 Claims, 5 Drawing Sheets

(56) References Cited

U.S. PATENT DOCUMENTS

| | | | |
|---|---|---|---|
| 7,180,036 B2 * | 2/2007 | Atlas | G05D 23/20 |
| | | | 165/206 |
| 2004/0244384 A1 * | 12/2004 | Yamazaki | H01L 21/67248 |
| | | | 62/3.2 |
| 2006/0242967 A1 | 11/2006 | Lin et al. | |
| 2008/0092818 A1 * | 4/2008 | Fink | H01L 21/67103 |
| | | | 118/724 |
| 2009/0000310 A1 * | 1/2009 | Bell | B60H 1/00271 |
| | | | 62/3.7 |
| 2010/0024982 A1 * | 2/2010 | Wallace | H01L 21/67109 |
| | | | 156/345.27 |
| 2012/0305044 A1 * | 12/2012 | Zykin | H01L 35/32 |
| | | | 136/201 |

* cited by examiner

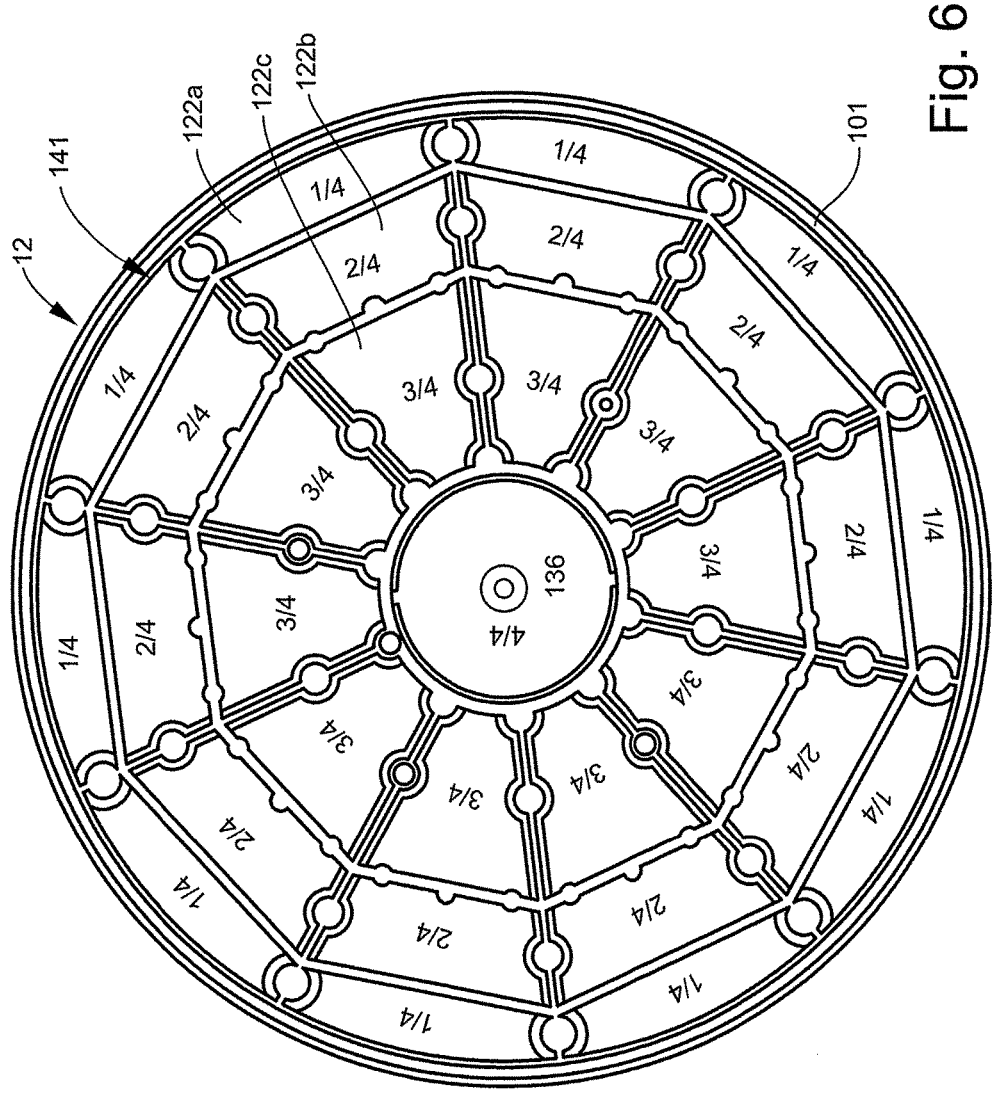

TEMPERATURE CONTROL SYSTEM FOR ELECTROSTATIC CHUCKS AND ELECTROSTATIC CHUCK FOR SAME

RELATED APPLICATION

This application claims the benefit of provisional application Ser. No. 61/718,680 filed Oct. 25, 2012.

BACKGROUND

Electrostatic and other chucks have been provided for use in semiconductor and other processing equipment. Systems for controlling the temperature of such chucks, and other components, of such processing equipment have been additionally provided. See, for example, U.S. Pat. Nos. 6,822,202 and 7,180,036. Some of such cooling systems utilize thermoelectric modules. See, for example, U.S. Patent Application Publication No. 2006/0242967. There is a need for a new temperature control system for semiconductor processing equipment that provides improved temperature control of a target.

SUMMARY OF THE INVENTION

A temperature control system, a wafer chuck, a thermal module for use with the chuck, and an apparatus for use in semiconductor manufacture are disclosed herein. The temperature control system includes: a target having a temperature, a fluid circulation loop coupled to the target for controlling the temperature of the target, a heating heat exchanger coupled to the fluid circulation loop for selectively providing heat to the fluid circulation loop, a cooling heat exchanger coupled to the fluid circulation loop for selectively providing cooling to the fluid circulation loop and a plurality of thermal electric elements carried by the target for selectively providing heating or cooling to the target. The heating heat exchanger and cooling heat exchanger provide gross control of the temperature of the target, and the plurality of thermal electric elements provide fine control of the temperature of the target.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

FIG. 6 is a perspective view of another embodiment of the thermal electric structure of the present invention.

DETAILED DESCRIPTION OF THE INVENTION

Figure 1:
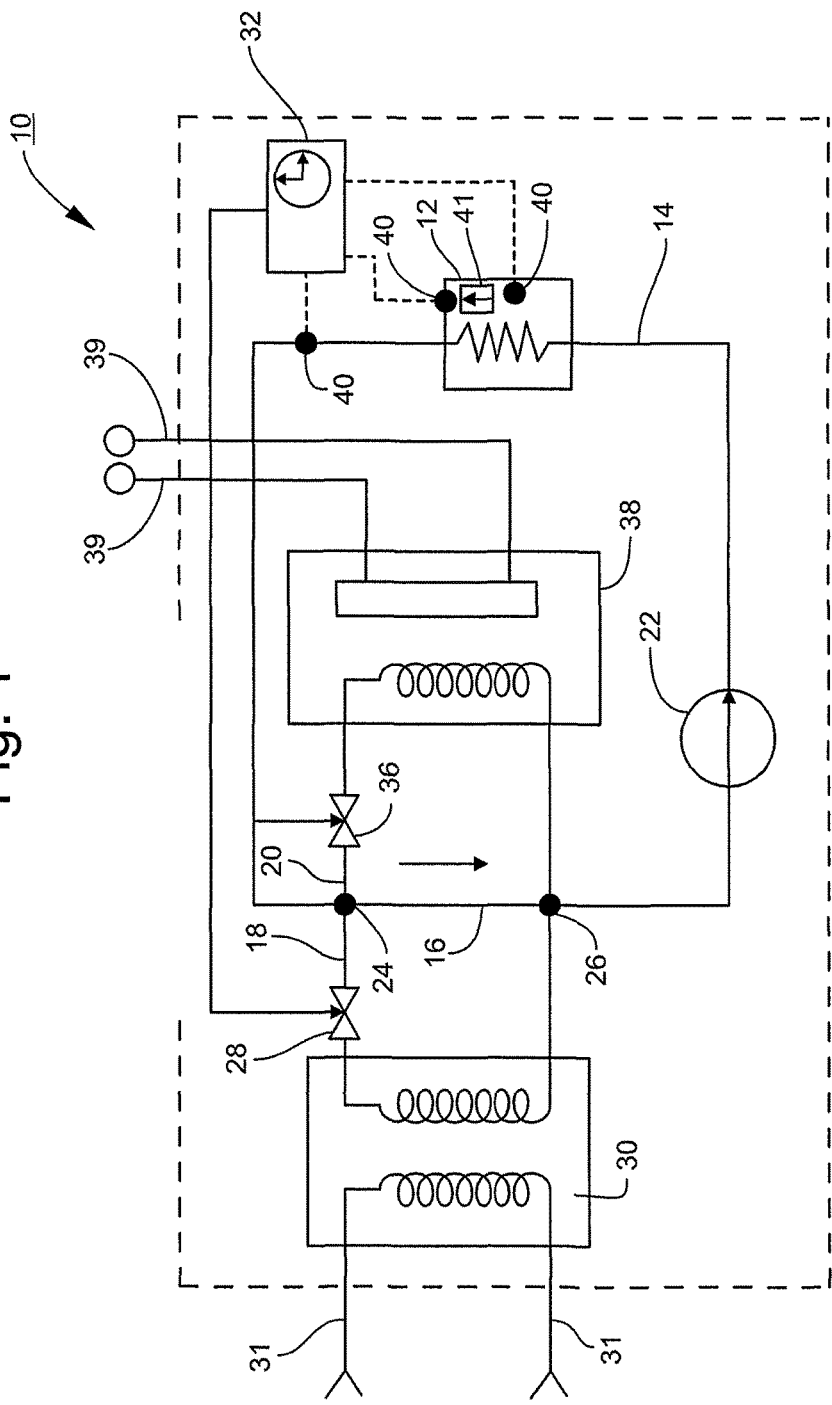
FIG. 1 is a schematic drawing of a temperature control system of the present invention.

An exemplary temperature control system of the present invention can include the system described in U.S. Pat. Nos. 6,822,202 and 7,180,036, the entire content of each of which is incorporated in its entirety herein by this reference. Temperature control system or semiconductor process temperature control system 10 can both heat and cool a target 12, such as an electrostatic or other chuck, using a temperature control fluid in a re-circulation loop 14 (see FIG. 1). In one embodiment, the re-circulation or fluid circulation loop 14 can include a through passage 16, a cooling passage 18, and a heating passage 20. The temperature control fluid can be pumped through the re-circulation loop 14 by a pump 22, and the loop 14 can extend through the target 12. The through passage 16, the cooling passage 18, and the heating passage 20 can be in parallel, and meet at a first branch 24 and at a second branch 26. The through passage 16 transports some of the temperature control fluid directly from the first branch 24 to the second branch 26.

A heating heat exchanger 38 can be coupled to the fluid circulation loop 14 for selectively providing heat to the fluid circulation loop, and a cooling heat exchanger 30 can be coupled to the fluid circulation loop 14 for selectively providing cooling to the fluid circulation loop 14. In one embodiment, a heating control valve 36 is provided for coupling the heating heat exchanger 38 to the fluid circulation loop, and a cooling control valve 28 is provided for coupling the cooling heat exchanger 30 to the fluid circulation loop 14. A controller 32 can be coupled to the heating control valve 36 and the cooling control valve 28 for selectively controlling the valves. In one embodiment, the cooling passage 18 can include a cooling valve 28 and a cooling heat exchanger 30 that is cooled by lines 31 that transport a refrigerated cooling fluid. The cooling valve 28 can be electrically operated under the control of a controller 32. The heating passage 20 can include a heating valve 36 and a heating heat exchanger 38, which can receive power or heat on lines 39. For example, the lines 39 can be electrical wires that supply power to a resistive heat source in the heating heat exchanger 38, or the lines 39 might transport a heated fluid through the heating heat exchanger. The heating valve 36 can also be electrically operated under the control of the controller 32.

The controller 32 can receive temperature information from at least one temperature sensor 40. The temperature sensor can be in thermal communication with the target 12 such that target temperature information is available to the controller 32. The temperature sensor 40 can be in direct thermal contact with the target 12, iri thermal contact with a material in or on the target, or in thermal contact with the temperature control fluid, beneficially as the temperature control fluid leaves the target area. More than one temperature sensor 40, including one or more of the temperature sensors 40 shown in FIG. 1, can supply information to the controller 32.

In operation of one embodiment, the controller 32 can be programmed to set the temperature of the target 12 at predetermined temperatures at predetermined times. The programmed or set temperature can be greater than the lowest temperature achievable from the cooling heat exchanger 30, and less than the highest temperature achievable from the heating heat exchanger 38. In one embodiment, if the temperature information from the temperature sensor 40 shows that the target temperature is less than the programmed temperature at the particular moment in time, the controller 32 can open the heating valve 36. This enables some of the temperature control fluid to flow through the heating heat exchanger 38, which heats the temperature control fluid. Such heated temperature control fluid can mix with the temperature control fluid that passes through the through passage 16, thus causing the temperature of the temperature control fluid to rise, which can cause the target temperature to rise. When the target temperature is correct, the controller 32 can close the heating valve 36.

In one embodiment, if the temperature information from the temperature sensor 40 indicates that the target temperature is greater than the programmed temperature at the particular instant, the controller can open the cooling valve 28. This can enable some of the temperature control fluid to flow through the cooling heat exchanger 30, which can cool the temperature control fluid. The cooled temperature control fluid can mix with the temperature control fluid that passes through the through passage 16, thus causing the temperature of the temperature control fluid to drop, which can cause the target temperature to drop. When the target temperature is correct or at a desired temperature, the controller 32 can close the cooling valve 28.

The controller 32 can beneficially, proportionally control the temperature of the target. That is, if a desired target or other temperature is far from the measured temperature, the controller 32 can cause significant heating or cooling. Then, as the current temperature approaches the desired temperature the rate of heating/cooling can decrease.

Figure 2:
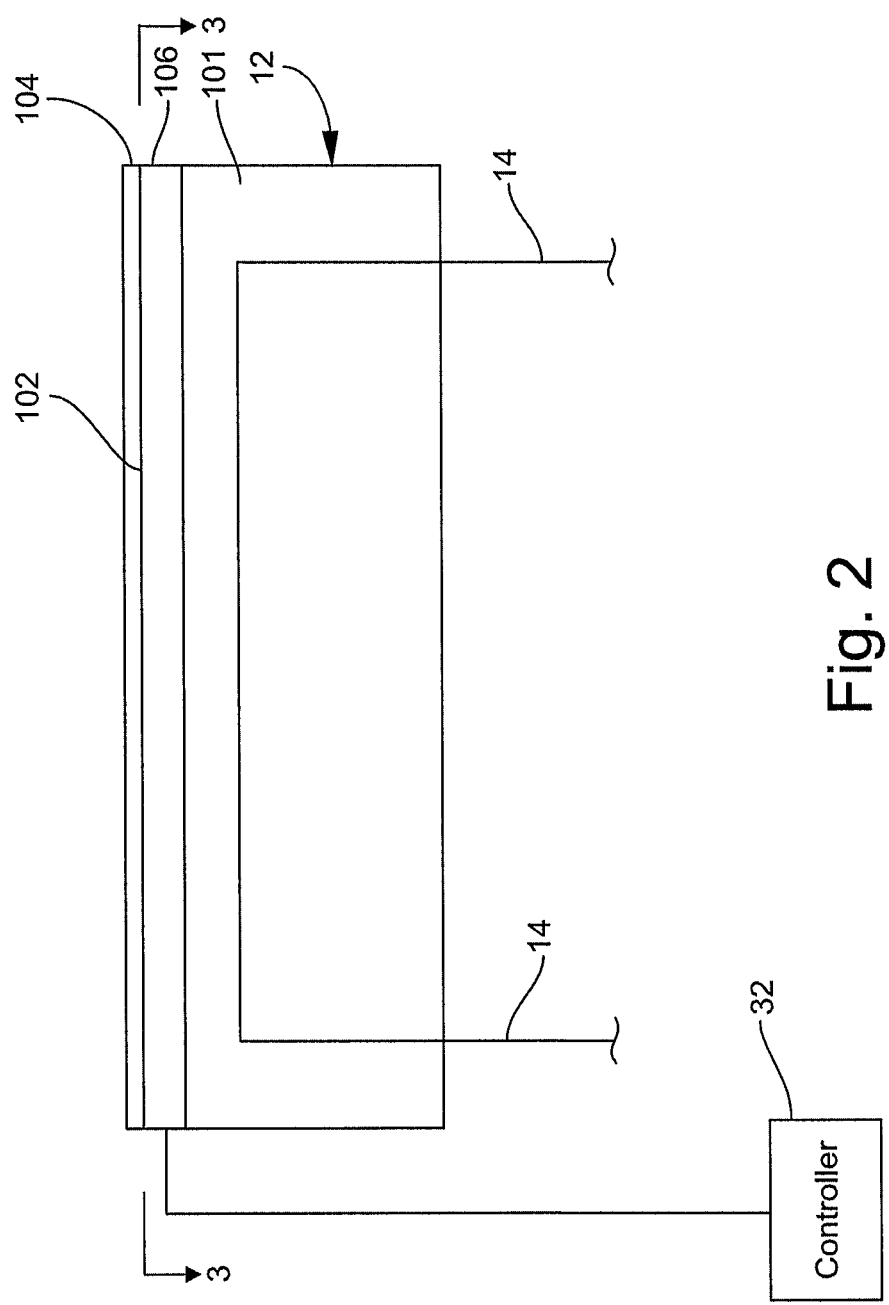
FIG. 2 is a schematic drawing of the target in the temperature control system of FIG. 1.

In one embodiment, as illustrated in FIG. 2, electrostatic chuck 12 includes a platen 101 having a surface 102, such as a top planar surface 102, that is adapted to receive a semiconductor wafer 104 for processing in a semiconductor manufacturing process. The platen 101 can include a thermal electric structure 106 which form top surface 102 of the chuck 12 or extend beneath or underlie the tope surface 102. The thermal electric structure 106 can be electrically coupled to controller 32. The thermal electric structure 106 can include a plurality of thermal electric elements 109, which in one embodiment can be a plurality of p-type and n-type semiconductor elements 109 alternatingly disposed in the structure with each p-type semiconductor element connected to an adjoining n-type semiconductor element by a junction (not shown). The thermal electric elements 109 can be electrically coupled to the controller 32. In this manner, for example, a plurality of thermal electric elements 109 can be carried by the target 12, for example by being disposed in the platen 101, for selectively providing heating or cooling to the target 12.

Figure 3:
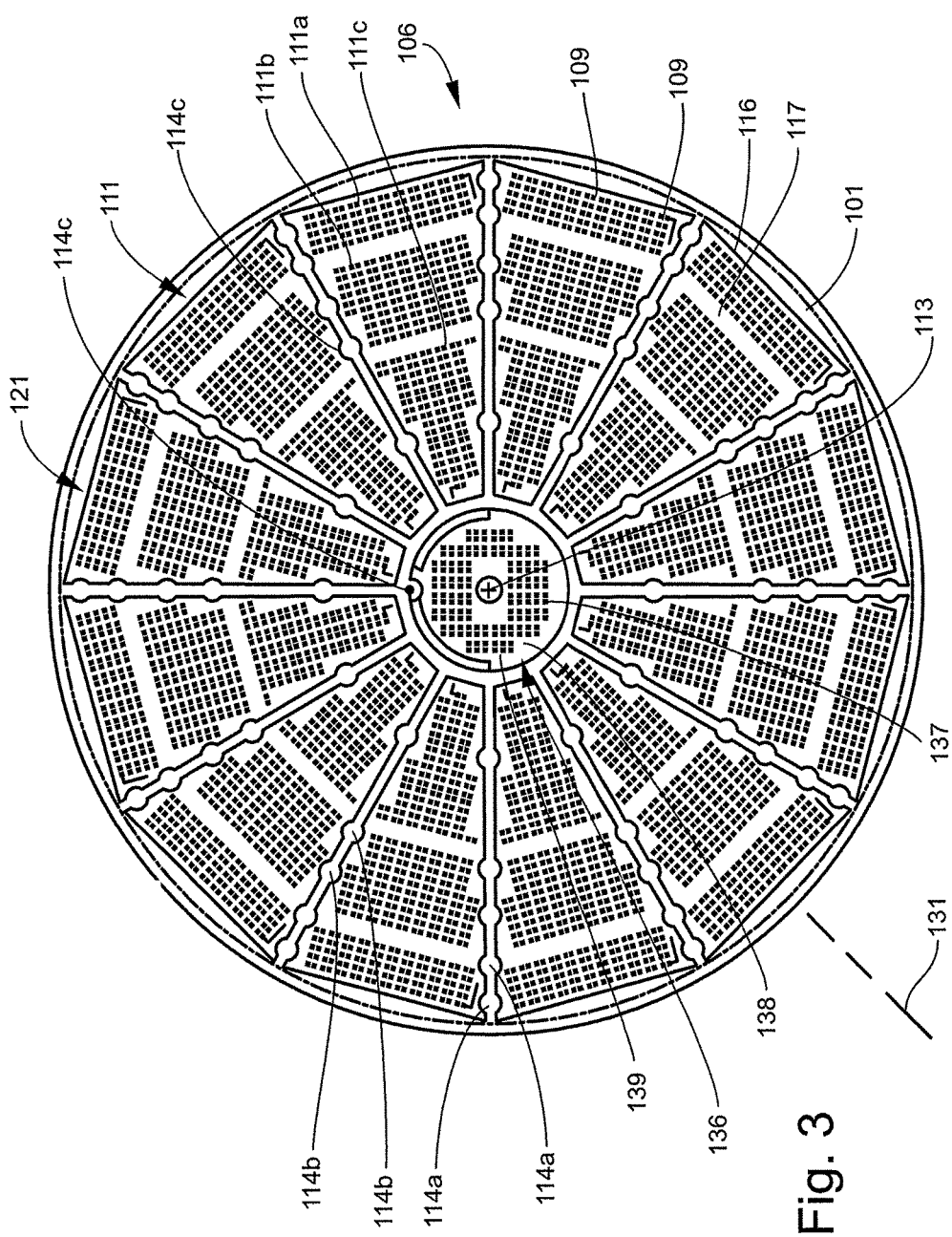
FIG. 3 is a top plan view of the thermoelectric assembly in the target of FIG. 2.

The structure 106 can be of any suitable size and shape, and in one embodiment has a size and shape that approximates the size and shape of chuck surface 102. In one embodiment, surface 102 is circular in shape when viewed in plan, and structure 106 can have a similar circular shape (see FIG. 3). In one embodiment, the plurality of p-type and n-type semiconductor elements 109 of the thermal electric structure 106 can be arranged in a plurality of circular arrays 111. In one embodiment, a first circular array 111a, a second circular array 111b and a third circular array 111c of thermal electric elements 109 can be provided in structure 106, as illustrated in FIG. 3. In one embodiment, the plurality of circular arrays 111 are concentric about the center 113 of the structure 106, and thus the center of the chuck 12. Each of the arrays 111 can form a respective zone 114 of thermal electric elements 109, such as first zone 114a, second zone 114b and third zone 114c. The plurality of arrays 111 can be spaced apart from each other so as to provide a respective plurality of discrete zones 114 on the surface 102 for selectively heating or cooling. In one embodiment, the p-type and n-type semiconductor elements 109 are spaced apart from each other by a distance 116 and the plurality of discrete circular zones are each separated by a space 117 that is greater than the distance 116.

Figure 4:
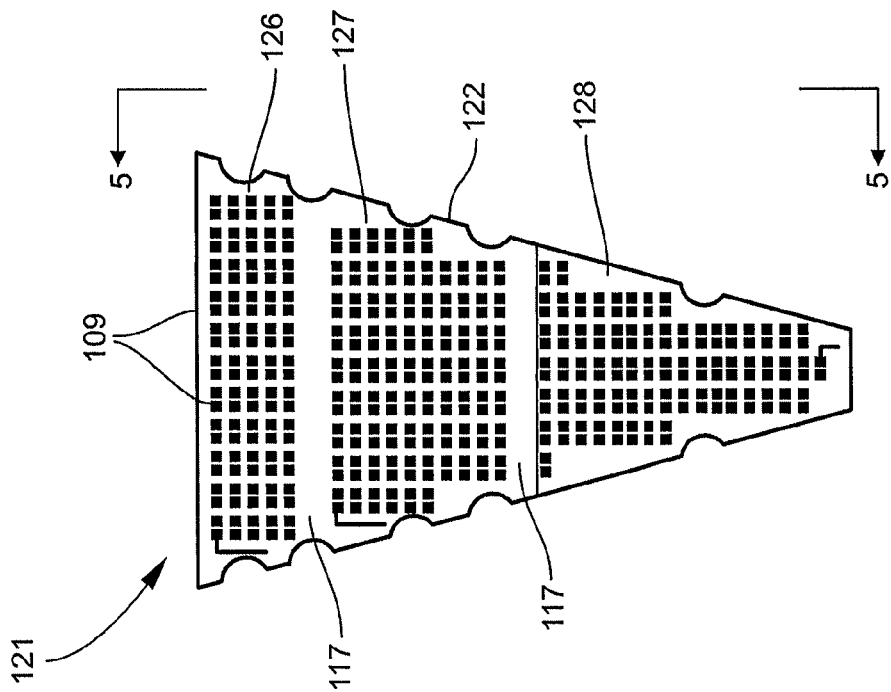
FIG. 4 is a top plan view of one of the thermoelectric elements of the thermoelectric assembly of FIG. 3.
Figure 5:
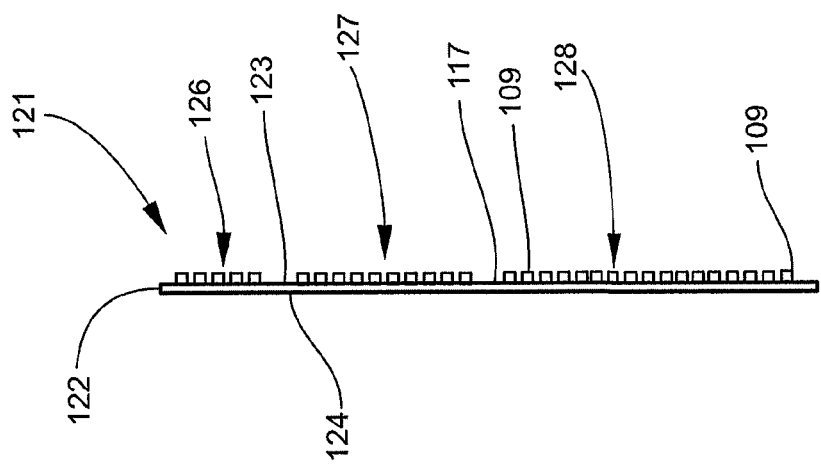
FIG. 5 is a side elevational view of the thermal electric element of FIG. 4.

In one embodiment, a circular thermal electric structure 106 can be formed from a plurality of discrete thermal electric modules 121. In one embodiment, each of such modules 121 can be in the shape of a wedge, as illustrated in FIGS. 3 and 4, or be referred to as being pie-shaped. The plurality of thermal electric modules 121 can be used for forming the first through third circular arrays 111a-111c of thermal electric elements 109 in the platen 101 of electrostatic chuck 12. In one embodiment, each of the thermal electric modules 121 can include a plate 122, made from any suitable material such as a ceramic, having a first or top surface 123 and a second or bottom surface 124. A first plurality 126 of thermal electric elements and a second plurality 127 of thermal electric elements, and in one embodiment additionally a third plurality 128 of thermal electric elements, can be provided on first or top surface 123. The pluralities 126-128 of thermal electric elements can be disposed on surface 123 in spaced apart positions, for example each separated by a space 117. In one embodiment, each of the plates 122 is identical in size and shape, and in one embodiment the respective pluralities 126-128 of thermal electric elements 109 of each of the plates are identical. In one embodiment, each of the thermal electric modules 121 is identical.

The plurality of the plates 122 of modules 121 can be disposed in a plane to substantially form the circle of one embodiment of thermal electric structure 106, as illustrated in FIG. 3. Each of the thermal electric modules 121 can be centered on a radius 131 of the structure 106, as illustrated in FIG. 3. When so assembled, the first plurality of thermal electric elements 126, the second plurality of thermal electric elements 127 and the third plurality of thermal electric elements 128 respectively form the first circular array 111a, the second circular array 11 1b and the third circular array 111c of thermal electric elements 109 of the structure 106.

A further thermal electric module 136 can be included in and disposed at the center of structure 106. In one embodiment, module 136 can be circular when viewed in plan, and can include an additional plurality 137 of thermal electric elements 109. The module 136 can be similar in structure to modules 121 and in this regard be formed by a plate 138 similar to plate 122 and having a first or top surface 139 on which the thermal electric elements 109 are disposed or mounted. The wedge-shaped thermal electric modules 121 can extend around additional module 136 and extend radially outwardly from the additional module. The additional plurality 137 of thermal electric elements 109 of module 136 can be included in one of zones 114a-c of the structure 106, or form an additional zone of the thermal electric structure.

In one embodiment, the void between each p-type semiconductor element 109 and adjoining n-type semiconductor element 109 can be partially or totally filled by an inert material for minimizing the ignition of plasma in the void during the semiconductor manufacturing process. In one embodiment, the inert material is a silicon gel.

In operation and use, temperature control system 10 can provide precise and rapid control of the temperature of target 12, and thus for example the wafer 104 being processed by in semiconductor processing operation. Heating heat exchanger 38 and cooling heat exchanger 30 can provide gross or coarse control of the temperature of the target 12 and the plurality of thermal electric elements 109 in the platen 101, for example thermal electric structure 106, can provide fine control of the temperature of the target 12.

The inclusion of the inert material between the thermal electric elements 109 facilitates use of the thermal electric structure in a plasma environment. Where the tops of the thermal electric elements 109 of structure 106 form surface 102 of the electrostatic chuck 12 or other target, the absence of a top layer of the target overlying the thermal electric elements 109 facilitates the fill of the voids between the elements 109 with the inert material. The absence of such top layer, which in some prior art chucks is formed of ceramic, eliminates the heat transfer layer of such top layer and thus improves the efficiency of the heat transfer in temperature control system 10 between the thermal electric elements 109 and the wafer 104 being processed. In addition, the absence of such top layer minimizes if not eliminates any differential thermal expansion and contraction between such top layer and the layer underlying the thermal electric elements 109, for example plates 122 of the thermal electric structure 106. The minimization or elimination of such differential thermal expansion can improve the efficiency of the semiconductor process by minimizing movement of the wafer during the process.

Other embodiments of the thermal electric structure of the present invention can be provided. For example a thermal electric structure 141 substantially identical to structure 106 can be provided in which each thermal electric module 121 is formed from three separate plates 122a, 122b and 122c, with the first plurality of thermal electric elements 126 disposed on first plate 122a, the second plurality of thermal electric elements 127 disposed on second plate 122b and the third plurality of thermal electric elements 128 disposed on third plate 122c. Thermal electric structure 141 is shown schematically in FIG. 6, with the plurality of thermal electric elements 126-128 not illustrated therein for simplicity.

Further embodiments may be described as follows:

A wafer chuck for use in processing a semiconductor wafer, comprising a platen having a surface adapted for receiving the wafer, an array of p-type and n-type semiconductor elements disposed in a plane of the platen and arranged in a plurality of discrete circular zones for selectively heating or cooling the surface. The wafer chuck above, wherein the array of p-type and n-type semiconductor elements underlie the surface. The wafer chuck above, wherein the array of p-type and n-type semiconductor elements form the surface. The wafer chuck above, wherein the platen has a center and the plurality of discrete circular zones are concentric about the center. The wafer chuck above, wherein the p-type and n-type semiconductor elements are spaced apart from each other by a distance and the plurality of discrete circular zones are each separated by a space that is greater than the distance. The wafer chuck above, wherein the array of p-type and n-type semiconductor elements are formed from a plurality of pie-shaped elements having some of the p-type and n-type semiconductor elements thereon. The wafer chuck above, wherein the plurality of pie-shaped elements are identical in size and shape.

A wafer chuck for use in processing a semiconductor wafer, comprising a platen having a center and having a surface adapted for receiving the wafer, a plurality of p-type and n-type semiconductor elements disposed in the platen and underlying the surface, the plurality of p-type and n-type semiconductor elements arranged in a plurality of circular arrays, the plurality of circular arrays being concentric about the center and being spaced apart from each other to provide a respective plurality of discrete zones on the surface for selectively heating or cooling. The wafer chuck above, wherein the plurality of circular arrays of p-type and n-type semiconductor elements are formed from a plurality of pie-shaped elements having some of the p-type and n-type semiconductor elements thereon. The wafer chuck above, wherein the plurality of pie-shaped elements are identical in size and shape. The wafer chuck above, wherein each of the plurality of pie-shaped elements is centered on a radius of the platen.

A thermal electric module for use in forming first and second circular arrays of thermal electric elements in a platen of an electrostatic chuck, comprising a plate having a surface and having the shape of a wedge, and first and second pluralities of thermal electric elements disposed on the surface in spaced apart positions wherein a plurality of the plates can be disposed in a plane to substantially form a circle having a center and the first and second pluralities of thermal electric elements respectively form the first and second circular arrays of thermal electric elements. The thermal electric module above, wherein the thermal electric elements in each of the first and second pluralities are spaced apart from each other by a distance and the first and second pluralities are separated by a space that is greater than the distance.

The present invention may be embodied in other forms without departing from the spirit and the essential attributes thereof, and, accordingly, reference should be made to the appended claims, rather than to the foregoing specification, as indicated the scope of the invention.

I claim:

1. A temperature control system for use in semiconductor wafer manufacture comprising:
   a target having a temperature, the target is an electrostatic chuck with a platen and the platen is adapted for receiving a semiconductor wafer;
   a fluid circulation loop coupled to the target for controlling the temperature of the target;
   a heating heat exchanger coupled to the fluid circulation loop for selectively providing heat to the fluid circulation loop;
   a cooling heat exchanger coupled to the fluid circulation loop for selectively providing cooling to the fluid circulation loop; and
   a plurality of thermal electric elements carried by the platen of the target for selectively providing heating or cooling to the target, the plurality of thermal electric elements are a plurality of p-type and n-type semiconductor elements,
   whereby the heating heat exchanger and cooling heat exchanger provide gross control of the temperature of the semiconductor wafer and the plurality of thermal electric elements provide fine control of the temperature of the semiconductor wafer.

2. The temperature control system of claim 1, further comprising a heating control valve for coupling the heating heat exchanger to the fluid circulation loop, a cooling control valve for coupling the cooling heat exchanger to the fluid circulation loop and a controller coupled to the heating control valve and the cooling control valve for selectively controlling the valves.

3. The temperature control system of claim 2, further comprising a temperature sensor coupled to one of the target and the fluid circulation loop and electrically coupled to the controller.

4. The temperature control system of claim 2, wherein the controller is electrically coupled to the plurality of thermal electric elements.

5. The temperature control system of claim 1, wherein the fluid circulation loop extends through the target.

6. The temperature control system of claim 1, wherein the plurality of thermal electric elements are disposed in a plurality of concentric circular zones.

\* \* \* \* \*